(12) United States Patent
Eldredge et al.

(10) Patent No.: US 9,595,334 B2
(45) Date of Patent: Mar. 14, 2017

(54) APPARATUS AND METHODS OF OPERATING MEMORY FOR EXACT AND INEXACT SEARCHING OF FEATURE VECTORS

(71) Applicant: MICRON TECHNOLOGY, INC., Boise, ID (US)

(72) Inventors: Kenneth J. Eldredge, Boise, ID (US); Frankie F. Roohparvar, Monte Sereno, CA (US); Luca De Santis, Avezzano (IT); Tommaso Vali, Sezze (IT)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 15/163,927

(22) Filed: May 25, 2016

(65) Prior Publication Data

US 2016/0267993 A1 Sep. 15, 2016

Related U.S. Application Data

(63) Continuation of application No. 13/864,444, filed on Apr. 17, 2013, now Pat. No. 9,355,026.
(Continued)

(51) Int. Cl.
*G06F 12/00* (2006.01)
*G06F 13/00* (2006.01)
(Continued)

(52) U.S. Cl.
CPC .............. *G11C 16/10* (2013.01); *G06F 7/02* (2013.01); *G06F 12/0246* (2013.01); *G11C 11/56* (2013.01); *G11C 11/5628* (2013.01); *G11C 15/046* (2013.01); *G11C 16/0483* (2013.01); *G11C 16/26* (2013.01); *G11C 16/34* (2013.01); *G06F 2207/00* (2013.01); *G06F 2207/025* (2013.01); *G11C 16/12* (2013.01); *G11C 16/14* (2013.01)

(58) Field of Classification Search
CPC ..... G11C 16/10; G11C 16/0483; G11C 16/26; G11C 16/34; G11C 16/12; G11C 16/14; G11C 11/56; G11C 11/5628; G11C 15/046; G06F 7/02; G06F 12/0246; G06F 2207/00; G06F 2207/025
USPC .................................................. 711/103, 108
See application file for complete search history.

(56) References Cited

U.S. PATENT DOCUMENTS

2008/0144374 A1 6/2008 Kato
2009/0190404 A1 7/2009 Roohparvar
(Continued)

*Primary Examiner* — Tuan Thai
*Assistant Examiner* — Shane Woolwine
(74) *Attorney, Agent, or Firm* — Dicke, Billig & Czaja, PLLC

(57) ABSTRACT

Apparatus and methods of operating a memory include storing a value of an attribute of a feature vector to a pair of memory cells by programming each of the memory cells to a respective data state of three or more data states, searching for an exact match to a particular value of the attribute by applying respective voltage levels to control gates of the memory cells to activate both memory cells only when the value of the attribute is the particular value, and searching for an inexact match to the particular value of the attribute by applying respective voltage levels to control gates of the memory cells to activate both memory cells when the value of the attribute is within a range of possible values of the attribute including the particular value.

20 Claims, 6 Drawing Sheets

Related U.S. Application Data

(60) Provisional application No. 61/625,294, filed on Apr. 17, 2012.

(51) Int. Cl.
| | |
|---|---|
| *G06F 13/28* | (2006.01) |
| *G11C 16/10* | (2006.01) |
| *G06F 12/02* | (2006.01) |
| *G11C 16/34* | (2006.01) |
| *G11C 11/56* | (2006.01) |
| *G11C 15/04* | (2006.01) |
| *G11C 16/04* | (2006.01) |
| *G06F 7/02* | (2006.01) |
| *G11C 16/26* | (2006.01) |
| *G11C 16/12* | (2006.01) |
| *G11C 16/14* | (2006.01) |

(56) References Cited

U.S. PATENT DOCUMENTS

| | | |
|---|---|---|
| 2010/0034018 A1 | 2/2010 | Yang et al. |
| 2011/0096612 A1 | 4/2011 | Steiner et al. |
| 2012/0324204 A1 | 12/2012 | Inoue |

APPARATUS AND METHODS OF OPERATING MEMORY FOR EXACT AND INEXACT SEARCHING OF FEATURE VECTORS

RELATED APPLICATIONS

This application is a Continuation of U.S. application Ser. No. 13/864,444 filed on Apr. 17, 2013, titled "SEARCHING USING MULTILEVEL CELLS AND PROGRAMMING MULTILEVEL CELLS FOR SEARCHING," which is commonly assigned and incorporated herein by reference. U.S. application Ser. No. 13/864,444 is a non-provisional of provisional application U.S. application Ser. No. 61/625,294, filed Apr. 17, 2012, titled "SEARCHING USING MLC CELLS AND PROGRAMMING MLC CELLS FOR SEARCHING," and is related to provisional application U.S. Application Ser. No. 61/476,574, filed Apr. 18, 2011, titled "METHODS AND APPARATUS FOR PATTERN MATCHING," each of which are commonly assigned.

TECHNICAL FIELD

The present embodiments relate generally to memory and a particular embodiment relates to searching using multiple level cells and programming such cells for searching.

BACKGROUND

Memory devices (which are sometimes referred to herein as "memories") are typically provided as internal, semiconductor, integrated circuits in computers or other electronic systems. There are many different types of memory including random-access memory (RAM), read only memory (ROM), dynamic random access memory (DRAM), synchronous dynamic random access memory (SDRAM), and flash memory.

Flash memory devices have developed into a popular source of non-volatile memory for a wide range of electronic applications. Flash memory devices typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common electronic systems that utilize flash memory devices include, but are not limited to, personal computers, personal digital assistants (PDAs), digital cameras, digital media players, digital recorders, games, appliances, vehicles, wireless devices, cellular telephones, and removable memory modules, and the uses for flash memory continue to expand.

Flash memory typically utilizes one of two basic architectures known as NOR flash and NAND flash. The designation is derived from the logic used to read the devices. In NOR flash architecture, a string of memory cells is coupled in parallel with each memory cell coupled to a data line, such as those typically referred to as digit (e.g., bit) lines. In NAND flash architecture, a string of memory cells is coupled in series with only the first memory cell of the string coupled to a bit line.

As the performance and complexity of electronic systems increase, the requirement for additional memory in a system also increases. However, in order to continue to reduce the costs of the system, the parts count must be kept to a minimum. This can be accomplished by increasing the memory density of an integrated circuit by using such technologies as multilevel cells (MLC). For example, MLC NAND flash memory is a very cost effective non-volatile memory.

Multilevel cells (which are also sometimes referred to herein as multiple level cells) can take advantage of the analog nature of a traditional charge storage cell by assigning a particular bit pattern to a specific threshold voltage (Vt) range stored on the cell. This technology permits the storage of two or more bits per cell, depending on the quantity of voltage ranges assigned to the cell and the stability of the assigned voltage ranges during the lifetime operation of the memory cell.

Content addressable memories (CAM) are memories that implement a search function in a single clock cycle. They use dedicated comparison circuitry to perform the searching. CAM memories are often used in network routers for packet forwarding and the like. Each individual memory cell in a CAM requires its own comparison circuit in order to allow the CAM to detect a match between a bit of an input feature vector and a bit stored in the CAM. Typical CAM cells use approximately nine to ten transistors for a static random access memory (SRAM)-based CAM, or four to five transistors for a dynamic random access memory (DRAM)-based CAM.

CAM devices can be used to store key words, also referred to as feature vectors, for later comparison. A feature vector can comprise a plurality of attributes that define an object. For example, a feature vector for a person might include hair color, height, weight, and other attributes that can be used to uniquely identify a particular person. While exact matching of attributes is useful, there are times when it is desired to match within a range of values for an attribute.

For the reasons stated above and for other reasons that will become apparent to those skilled in the art upon reading and understanding the present specification, there is a need in the art for a more streamlined approach for comparison of input feature vectors to known feature vectors.

DETAILED DESCRIPTION

Figure 1:
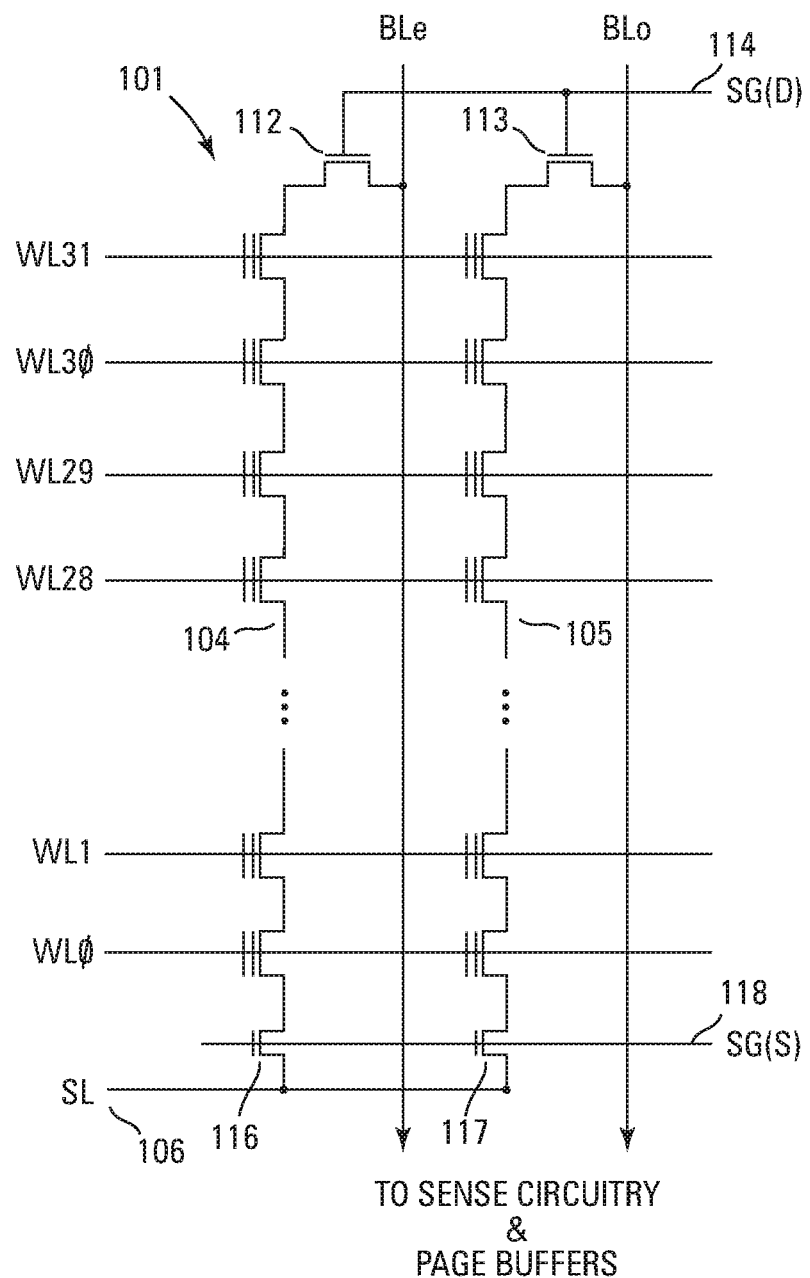
FIG. 1 is a schematic diagram of one embodiment of a portion of a memory array.

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

FIG. 1 illustrates a schematic diagram of one embodiment of a portion of a NAND architecture memory array 101 comprising series strings of non-volatile memory cells. The present embodiments of the memory array are not limited to the illustrated NAND architecture.

The memory array 101 comprises an array of non-volatile memory cells (e.g., floating gate) arranged in columns such as series strings 104, 105. Each of the cells is coupled drain to source in each series string 104, 105. An access line (e.g., word line) WL0-WL31 that spans across multiple series strings 104, 105 is coupled to the control gates of each memory cell in a row in order to bias the control gates of the memory cells in the row. Data lines, such as even/odd bit lines BLe, BLo, are coupled to the series strings and eventually coupled to sense circuitry (e.g., sense amplifier) (not shown) that detects the state of each cell by sensing current or voltage on a selected bit line. The bit lines BLe, BLo are also coupled to page buffers (not shown) that can be programmed by data from each selected word line. The sense circuitry and page buffers may be part of the same circuitry or the page buffers can be separate circuitry.

Each series string 104, 105 of memory cells is coupled to a source line 106 by a source select gate 116, 117 (e.g., transistor) and to an individual even or odd bit line BLe, BLo by a drain select gate 112, 113 (e.g., transistor). The source select gates 116, 117 are controlled by a source select gate control line SG(S) 118 coupled to their control gates. The drain select gates 112, 113 are controlled by a drain select gate control line SG(D) 114.

In a typical programming of the memory array, each memory cell is individually programmed as either a single level cell (SLC) or a multiple level cell (MLC). The cell's threshold voltage ($V_t$) can be used as an indication of the data stored in the cell. For example, in an SLC, a $V_t$ of 2.5V might indicate a first data state while a $V_t$ of –0.5V might indicate a second data state. An MLC uses multiple $V_t$ ranges that each indicates a different data state. Multiple level cells can take advantage of the analog nature of a traditional charge storage cell by assigning a respective bit pattern to each of the data states.

The subsequently described embodiments can use a memory array (e.g., FIG. 1) to store feature vectors for subsequent searching and comparing by a controller (e.g., memory controller) to a target vector (e.g., key) that is input to the memory. Methods for searching include, for example, searching for inexact matches, i.e., for matches within a range of values for an attribute(s). More specifically, in MLC memories, as opposed to single level cell (SLC) memories, a memory cell could be used to store two bits (4 data states), three bits (8 data states) or more per cell. In these instances, an increased number of data states allows for matching within a range of values for an attribute as well as exact matching. For example, the matching within a range of values for an attribute can be accomplished using a single pair of memory cells as opposed to multiple cells, or for multiple data states of an attribute in a single multiple level cell as opposed to multiple cells over multiple strings of cells.

A feature vector can be represented by $F(A)=A_1, A_2, A_3, A_4, \ldots A_n$ where "A" can be an attribute that defines a particular object. Each attribute "A" can have a value represented by a number (e.g., binary, decimal). For example, if $A_1$ is defined as a binary 1101 (decimal 13), this might be stored in four memory locations. In an MLC embodiment at least a portion of a value of an attribute (e.g., which could include the entire value of the attribute) may, depending upon a number of binary digits used to represent the value of the attribute, be programmed into a single pair of multiple level cells. In an MLC embodiment, values for multiple attributes (or variations of attributes) can also be programmed into a single cell.

Figure 2:
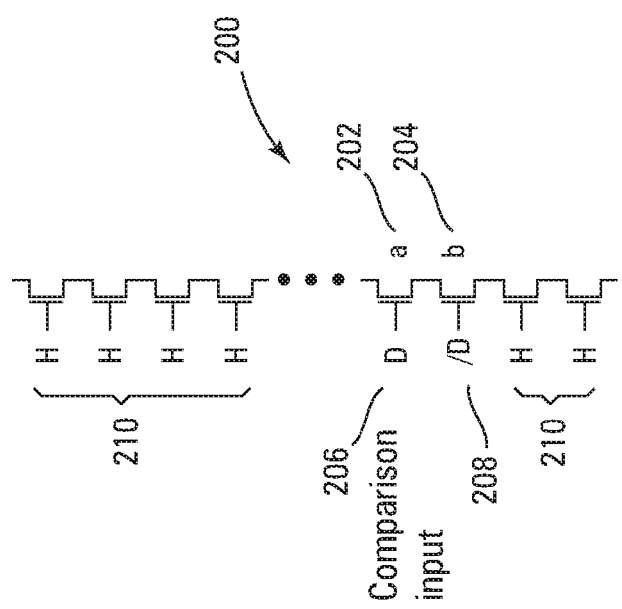
FIG. 2 is a diagram of a portion of a NAND string according to one embodiment of the present disclosure.

FIG. 2 shows a portion of a NAND string 200 programmed in accordance with one embodiment of the present disclosure. The value for an attribute of a feature vector is programmed into a pair of cells 202 and 204. Although depicted in the illustrated embodiment as adjacent cells, the cells of a pair need not be adjacent, although it may be advantageous in some embodiments to use adjacent cells for a pair. The cells, according to one embodiments, are multiple level cells which can each be programmed to a respective one of a number of different data states. For example, each cell of the string of cells 200 shown in FIG. 2 can be programmed to a respective one of eight different data states, and the cells of the string are broken into distinct pairs. In this document, each data state is assigned for purposes of clarity a number, 1 through 8. These numbers correspond to eight discrete $V_t$ ranges to which the cells are programmable. It should be understood that the numbers 1 through 8 are used to show different data states, and that the actual threshold voltage ranges of the cells are determinable and can depend on the actual number of data states and the cells themselves. In one embodiment, a pair of cells 202 and 204 are programmed, each cell of the pair being programmed to a respective one of the eight discrete threshold voltage ranges. In one embodiment, each pair of cells is programmed into one of a plurality of data state pairs, such as 1 8, 2 7, 3 6, 4 5, 5 4, 6 3, 7 2, and 8 1 (where the numbers 1-8 refer to the 8 different data states) to represent at least a portion of a value for an attribute of a feature vector.

An input feature vector (e.g., defining an object to be matched or nearly matched) may be used as input to the string 200 of memory cells. For example, although embodiments are envisioned in which the value for an attribute of an input feature vector is programmed across more than one pair of memory cells or the values for a plurality of attributes are programmed into a single pair of memory cells, in an embodiment where the value for a particular attribute of an input feature vector is stored in a single pair of memory cells in a string, a pair of gate voltages can be generated responsive to the value of that same attribute in the input feature vector and applied to the corresponding pair of memory cells in the string. For a comparison of a value of a single attribute of the input feature vector to a value of the same attribute in the data feature vector programmed into the string 200, gate voltages labeled D and /D are applied to gates 206 and 208 of programmed cells 202 and 204, and a pass voltage higher than any threshold voltage corresponding to any of the data states of the string 200 is applied to the remainder of the memory cells of the string 210. It should be understood that the programmed data states indicated by levels 1-8 are in one embodiment offset by a threshold voltage from the comparison inputs D and /D.

Figure 3:
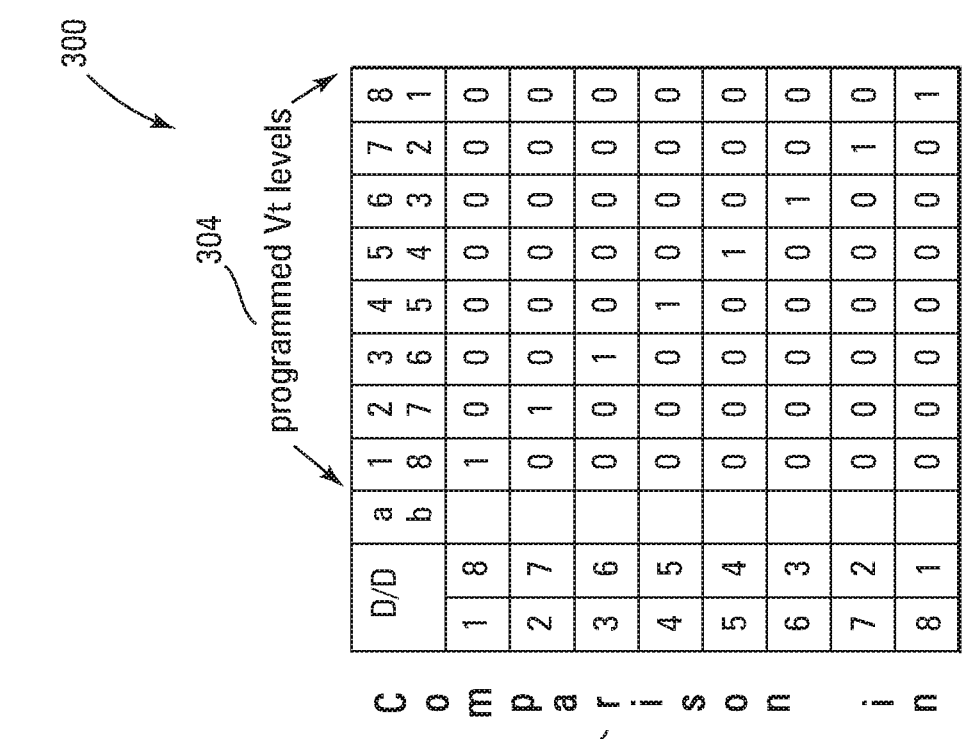
FIG. 3 is a table showing data states of a cell according to one embodiment of the present disclosure.

Continuing with such a single attribute comparison example, the string 200 will conduct only when the gate voltages applied to gates 206 and 208 of cells 202 and 204 are respectively higher than the threshold voltages to which the cells 202 and 204 are programmed, respectively. Referring also to FIG. 3, a table 300 of gate voltage pairs (represented by the data state numbers to which they respectively correspond) 302 and data state pairs 304 to which a pair of memory cells may be programmed to store at least a portion of a value of an attribute is shown. Conduction of the string is shown as a 1 in the table 300. For example, for a comparison of only a single attribute, if a pair of gate voltages corresponding to data states 2 and 7 (where the data state pair 2 7 is used to represent a particular value of the attribute in the input feature vector) are applied to the gates 206 and 208 of a pair of memory cells 202 204 used to store a value of that attribute of the data feature vector, the string conducts only when cells 202 and 204 are programmed to data states 2 and 7 respectively. If the pair of memory cells 202 and 204 are programmed to any of the other data state pairs illustrated in the table 300, the string will not conduct. In this embodiment, only an exact match among the illustrated data state pairs, then, results in conduction of the NAND string 200.

Using comparison inputs allows in additional embodiments for tying one of a comparison input pair of levels (e.g., 1 8) to a specific threshold voltage level, to allow for a greater than or less than operation. Tying both comparison inputs to specific levels allows for "between" ranges to be determined. This can be useful in pattern matching when an exact match is not necessarily desired, for example in situations such as a range of skin or hair colors, i.e., lighter than or darker than a certain hue or pigmentation.

In one embodiment, the value of an attribute of a data feature vector can be programmed into a pair of cells of a string of multiple level cell memory cells. For example, an attribute of a data feature vector may be hair color. Using hair color as an attribute, and using multiple level cell memory cells having eight (8) different data states, a pair of such memory cells corresponding to that attribute may be programmed to data states 1 and 8 (e.g., a first one of the pair may be programmed to data state 1 and a second one of the pair may be programmed to data state 8) to represent white hair for that attribute in a particular data feature vector. Meanwhile, continuing with this example, to represent light blonde hair for that attribute in that data feature vector, this pair of memory cells could be programmed to data states 2 and 7, for example (where, e.g., data state pair 3 6 could be used for blonde hair, data state pair 4 5 could be used for light brown hair, data state pair 5 4 could be used for red hair, data state pair 6 3 could be used for brown hair, data state pair 7 2 could be used for dark brown hair, and data state pair 8 1 could be used for black hair). Then, searching can be done for an exact match on the attribute, or for an inexact match. For example, a search can be made, by applying a corresponding pair of gate voltages to the pair of memory cells used to store the value for that attribute of a data feature vector, for a hair color lighter than dark brown, darker than brown, or for a range from red to dark brown. While examples of range functions, less than functions and greater than functions are provided, it should be understood that they are provided as examples only, and are not limiting in the range, or in the specific attributes that are amenable for use with the present disclosure.

Figure 4:
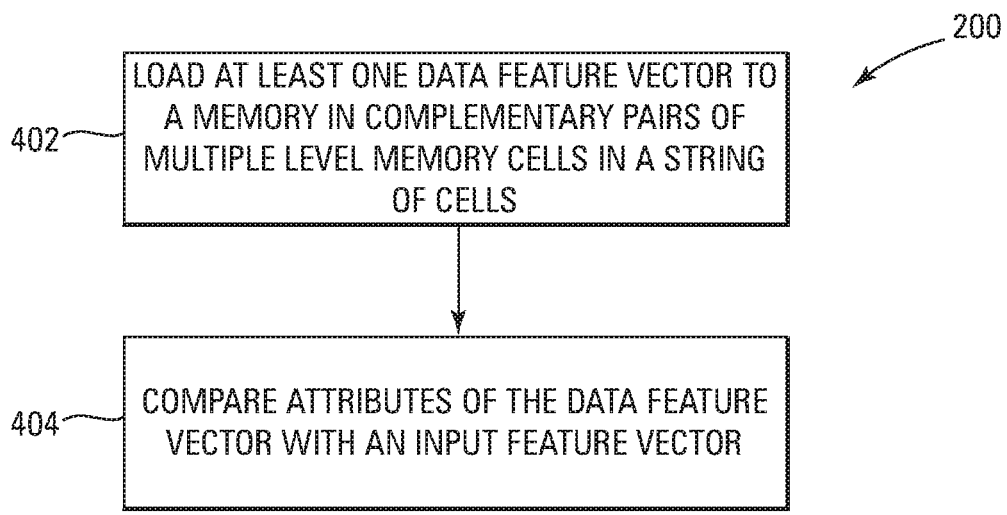
FIG. 4 is a flow chart diagram of a method according to an embodiment of the present disclosure.

Referring to FIG. 4, a method 400 according to one embodiment of the disclosure comprises programming a data feature vector in a memory, wherein at least a portion of a value (which could be the entire value) of an attribute of the data feature vector is programmed into a pair of multiple level memory cells in a string of cells of the memory in block 402, and comparing an input feature vector to the data feature vector in block 404.

Figure 5:
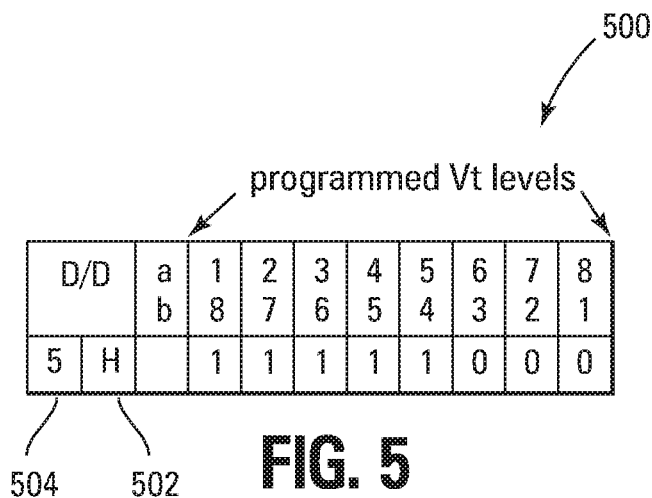
FIG. 5 is a table showing a less than function according to an embodiment of the present disclosure.
Figure 6:
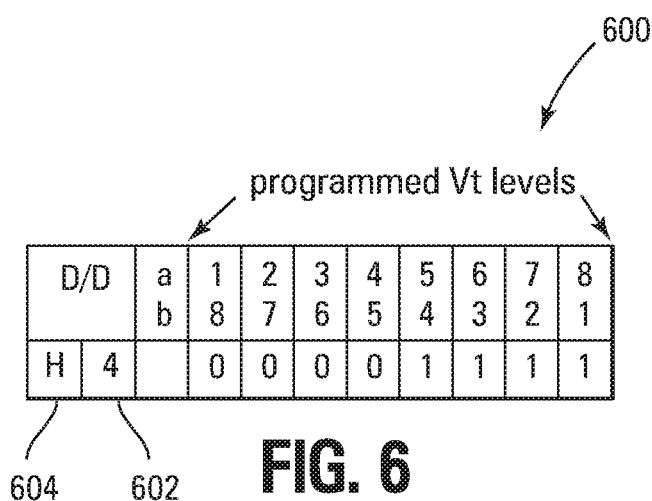
FIG. 6 is a table showing a greater than function according to an embodiment of the present disclosure.
Figure 7:
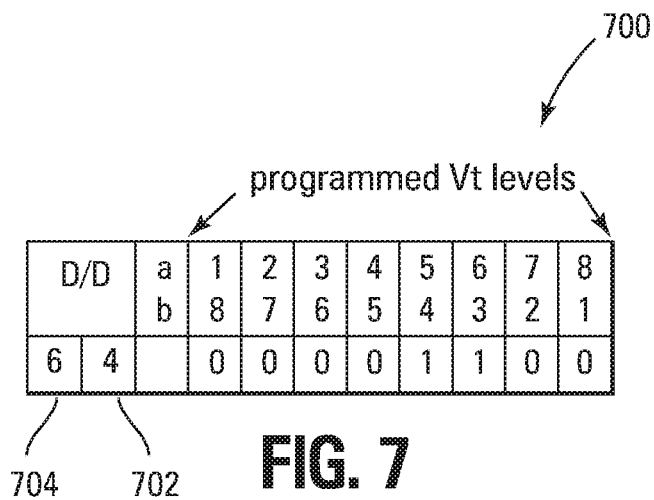
FIG. 7 is a table showing a range function according to an embodiment of the present disclosure.

Comparing in the method may be accomplished in various ways. For example only, and not by way of limitation, comparing in one embodiment comprises determining whether the value of an attribute of the data feature vector exactly matches a value for the same attribute of the input feature vector. In another embodiment, comparing comprises determining whether the value of an attribute of the data feature vector matches within a particular range of values for the same attribute of the input feature vector. The range of values can be a less than function as shown in FIG. 5, a greater than function as shown in FIG. 6, or a range function as shown in FIG. 7, for example. Range functions can be accomplished using different biasing schemes for the target vector inputs. That is, matching an attribute can be done so that matching is within a range by tying one of the D or /D inputs to a voltage higher than any of the threshold voltages of the levels of the multiple level cells of the feature vector. This has the effect of making conduction dependent only on the state of the other input. This matching can be a greater than type of matching 500 as shown in FIG. 5, that is, current will flow in the NAND string for all programmed levels above a certain level of comparison input; a less than type of matching 600 as shown in FIG. 6, that is, current will flow in the NAND string for all programmed levels below a certain level of comparison input; or a range type of matching 700 as shown in FIG. 7, that is, current will flow in the NAND string for all programmed levels between a pair of levels of comparison input.

In an embodiment, however, applying a pair of gate voltages (or programming a pair of memory cells to a data state pair) other than those illustrated in the table 300 can be used to allow for, for example, range functions, greater than functions and/or less than functions. For example, if the data state pairs and gate voltage pairs illustrated in table 300 are representative of all of the potential values for a particular attribute, then other gate voltage pairs and/or other data state pairs can be used to provide range functions, greater than functions and/or less than functions.

Referring to FIG. 5, for example, if a pair of gate voltages corresponding to the pair of data states 5 (504) and high H (502), where H is a voltage higher than any of the state, are applied to the gates 206, 208 of memory cells 202, 204 for a particular attribute (and pass voltages are applied to all of the other cells of the string), then the string 200 will conduct if the value of that attribute in the data feature vector is any of the values represented by data state pairs 1 8, 2 7, 3 6, 4 5 or 5 4. Accordingly, applying a pair of gate voltages corresponding to the pair of data states 5 H can be used to search for data feature vectors that have a value for that attribute which is less than the value represented by the data state pair 6 3.

Referring to FIG. 6, for example, if a pair of gate voltages corresponding to the pair of data states H (602) and 4 (602) are applied to the gates 206, 208 of memory cells 202, 204 for a particular attribute (and pass voltages are applied to all of the other cells of the string), then the string 200 will conduct if the value of that attribute in the data feature vector is any of the values represented by data state pairs 5 4, 6 3, 7 2, or 8 1. Accordingly, applying a pair of gate voltages corresponding to the pair of data states H 4 can be used to search for data feature vectors that have a value for that attribute which is greater than the value represented by the data state pair 4 5.

Referring to FIG. 7, for example, if a pair of gate voltages corresponding to the pair of data states 6 (702) and 4 (704) are applied to the gates 206, 208 of memory cells 202, 204 for a particular attribute (and pass voltages are applied to all of the other cells of the string), then the string 200 will conduct if the value of that attribute in the data feature vector is any of the values represented by data state pairs 5 4 or 6 3. Accordingly, applying a pair of gate voltages corresponding to the pair of data states 6 4 can be used to search for data feature vectors that have a value for that attribute within a range of values (e.g., between the values represented by data state pairs 4 5 and 7 2, which can alternatively be stated as greater than the value represented by data state pair 4 5 and less than the value represented by data state pair 7 2) wherein the range of values includes the values represented by the data state pairs 5 4 and 6 3.

As can be understood by one of ordinary skill in the art, data feature vectors can also be programmed to allow for range functions, greater than functions and/or less than functions from the perspective of the data feature vector. For example, if a pair of memory cells are programmed to data states 5 and 8, then the string 200 will conduct if the value of the corresponding attribute in an input feature vector is less than the value represented by the data state pair 6 3. As can be understood by one of ordinary skill in the art, similar extensions of the concepts discussed with respect to FIGS. 6 and 7 can be implemented to allow for less than functions and range functions from the perspective of the stored data feature vector (as opposed to the input feature vector).

For the various matching embodiments, matching may be accomplished using a comparison input provided to the complementary pairs of multiple level cells to detect the desired function for the feature vector. For example, the comparison input can be one input to one of the complementary multiple level cells of a pair of multiple level cells at a voltage greater than a highest threshold voltage of any of the levels, and a second input to the other of the complementary multiple level cells at a voltage equal to a threshold voltage above which the other of the complementary pair of multiple level cells conducts for a greater than function. The comparison input can be one input to one of the complementary multiple level cells of a pair of multiple level cells at a voltage equal to a threshold voltage below which the other of the complementary multiple level cells conducts, and a second input to the other of the complementary multiple level cells at a voltage greater than a highest threshold voltage of any of the levels for a less than function. The comparison input can be one input to one of the complementary multiple level cells of a pair of multiple level cells at a voltage above which one of the complementary multiple level cells conducts, and a second input to the other of the complementary multiple level cells at a voltage below which the other of the complementary multiple level cells conducts for a range function.

As such, conduction in a complementary pair of multiple level memory cells in a string of cells of the memory may be in one embodiment dependent on only one of the multiple level cells of the complementary pair of cells. In another embodiment, conduction in a complementary pair of multiple level memory cells in a string of cells of the memory may be dependent on each of the multiple level cells of the complementary pair of cells.

Figure 8:
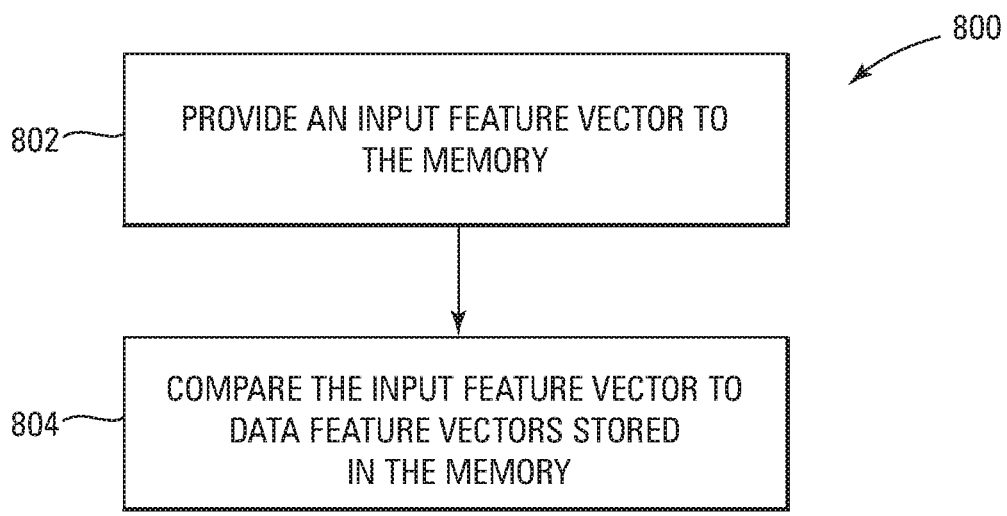
FIG. 8 is a flow chart diagram of a method according to an embodiment of the present disclosure.

Referring to FIG. 8, in another embodiment, a method 800 of searching comprises providing an input feature vector to be searched in the memory in block 802, and comparing the input feature vector to data feature vectors stored in the memory in block 804.

Figures 9, 10:
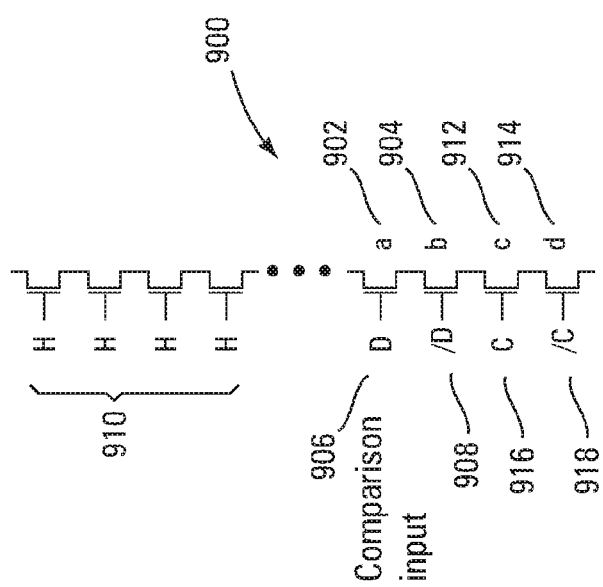
FIG. 9 is a diagram of a portion of a NAND string according to another embodiment of the present disclosure.
FIG. 10 is a table showing data states of a cell according to another embodiment of the present disclosure.

Although the embodiments discussed with respect to FIGS. 2-7 primarily focus on an example where the value of a single attribute in an input feature vector is compared to the value of that same attribute in a data feature vector(s), as shown in FIG. 9, more than one attribute can be compared at substantially the same time within a single string (such as string 202). FIG. 9 shows a NAND string 900 having a first pair of cells 902 and 904 programmed with a value of a first attribute of a data feature vector, and a second pair of cells 912 and 914 programmed with a value of a second attribute. The second attribute can be an attribute of the same data feature vector as the first attribute, or it can be an attribute of a different data feature vector. Terms such as "first" and "second" are not used herein to refer to any particular priority or ordering, but are instead used merely as points of reference to ease understanding of the embodiment. For a comparison of both attributes, two sets of gate voltage pairs are applied to the string. In this embodiment, a gate voltage pair labeled D and /D is applied at gates 906 and 908 to programmed cells 902 and 904; and a gate voltage pair labeled C and /C is applied at gates 916 and 918 to programmed cells 912 and 914. If only those two attributes are being compared, a pass voltage higher than any threshold voltage corresponding to a data state of the string 900 is applied to the remainder of the memory cells of the string 910. For each of these attributes, matching can be done in a similar manner as was described with respect to, for example, FIGS. 5-7.

The embodiments of searching described herein can be expanded to any number of data states. For example, ten data states are shown in FIG. 10, where a pair of cells might be programmed to one of 10 different data state pairs to represent a respective one of ten different values of an attribute, such as 0 9, 1 8, 2 7, 3 6, 4 5, 5 4, 6 3, 7 2, 8 1, and 9 0. It should be understood that the greater than, less than, and range functions described above are equally amenable to use with any number of data states without departing from the scope of the disclosure.

Figure 11:
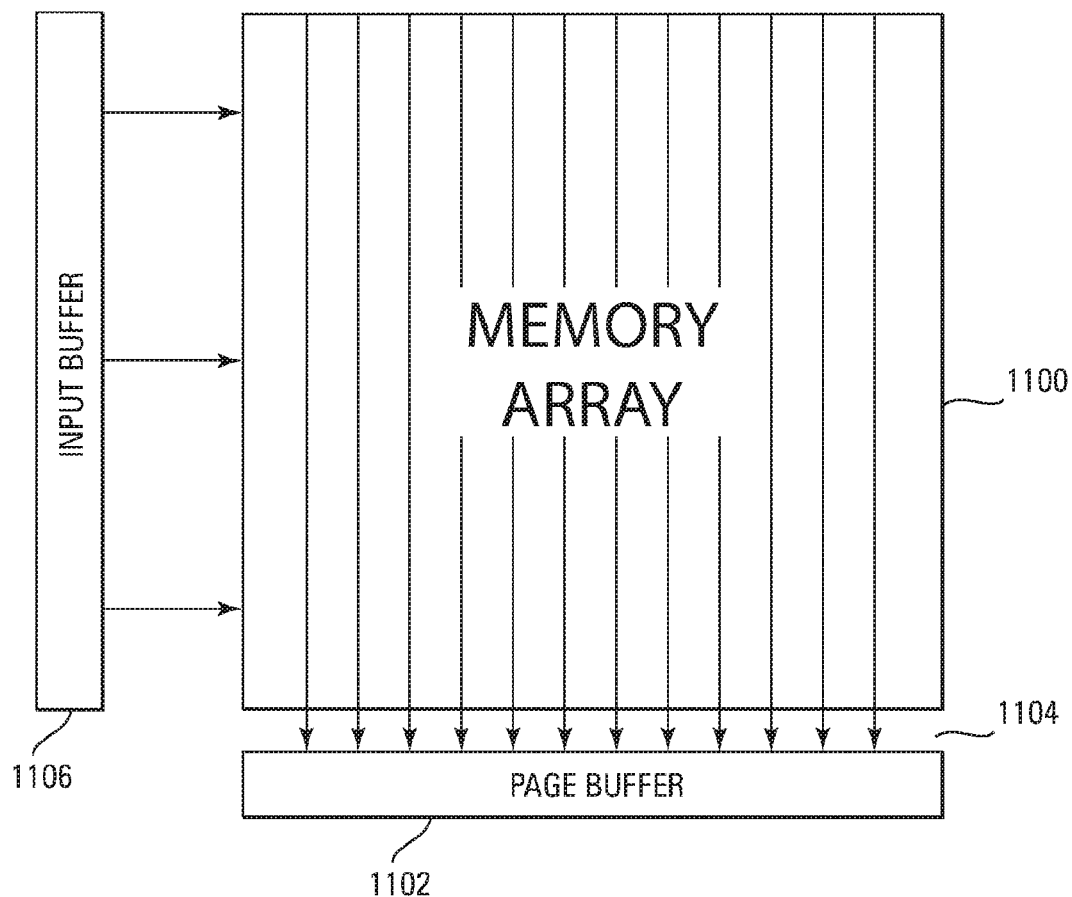
FIG. 11 is a block schematic of an electronic system in accordance with an embodiment of the disclosure.

The searching and programming methods described above with respect to FIGS. 2-10 can be performed in a page buffer of a memory array 1100, as illustrated in FIG. 11. FIG. 11 shows a page buffer 1102 coupled to bit lines 1104 of the memory array 1100. An input buffer 1106 is also coupled to the memory array 1100. The input buffer 1106 can be used to temporarily store input feature vectors for comparison to the data feature vectors stored in the memory array 1100. The memory array 1100 can comprise a plurality of series strings of memory cells as illustrated in FIG. 1, and can be part of a memory device that may be connected to and operated as part of a system with a memory access device (e.g., an external controller), such as a processor.

Methods for operating a memory may be performed in various embodiments on a memory such as memory 1101. Such methods are shown and described herein with reference to FIGS. 2-10.

CONCLUSION

In summary, one or more embodiments of a method for searching using multiple level cells in a memory device provide a way to search for an exact match, as well as for matches within a range including greater than, less than, or both.

Although specific embodiments have been illustrated and described herein, it will be appreciated by those of ordinary skill in the art that any arrangement that is calculated to achieve the same purpose may be substituted for the specific embodiments shown. Many adaptations of the disclosure will be apparent to those of ordinary skill in the art.

Accordingly, this application is intended to cover any adaptations or variations of the disclosure.

What is claimed is:

1. A method of operating a memory, comprising:
storing a value of an attribute of a feature vector to a pair of memory cells of a string of series-connected memory cells of the memory by programming each memory cell of the pair of memory cells to a respective data state of N possible data states with N being an integer value greater than two, wherein each possible value of the attribute of the feature vector is represented by a respective combination of two data states of the N possible data states;
searching for an exact match to a particular value of the attribute of the feature vector by applying respective voltage levels to control gates of the pair of memory cells to activate both memory cells of the pair of memory cells only when the value of the attribute of the feature vector is the particular value; and
searching for an inexact match to the particular value of the attribute of the feature vector by applying respective voltage levels to the control gates of the pair of memory cells to activate both memory cells of the pair of memory cells when the value of the attribute of the feature vector is within a range of possible values of the attribute of the feature vector including the particular value.

2. The method of claim 1, wherein the attribute of the feature vector is a first attribute of the feature vector, the method further comprising:
storing a value of a second attribute of the feature vector to a different pair of memory cells of the string of series-connected memory cells of the memory by programming each memory cell of the different pair of memory cells to a respective data state of the N possible data states, wherein each possible value of the second attribute of the feature vector is represented by a respective combination of two data states of the N possible data states;
searching for an exact match to a particular value of the second attribute of the feature vector by applying respective voltage levels to control gates of the different pair of memory cells to activate both memory cells of the different pair of memory cells only when the value of the second attribute of the feature vector is its particular value; and
searching for an inexact match to the particular value of the second attribute of the feature vector by applying respective voltage levels to the control gates of the different pair of memory cells to activate both memory cells of the different pair of memory cells when the value of the second attribute of the feature vector is within a range of possible values of the second attribute of the feature vector including its particular value.

3. The method of claim 2, further comprising:
concurrently searching for an exact match to both the particular value of the first attribute of the feature vector and the particular value of the second attribute of the feature vector by applying respective voltage levels to the control gates of the pair of memory cells and the different pair of memory cells to activate both memory cells of the pair of memory cells and both memory cells of the different pair of memory cells only when the value of the first attribute of the feature vector is its particular value and when the value of the second attribute of the feature vector is its particular value; and
concurrently searching for an inexact match to both the particular value of the first attribute of the feature vector and the particular value of the second attribute of the feature vector by applying respective voltage levels to the control gates of the pair of memory cells and the different pair of memory cells to activate both memory cells of the pair of memory cells and both memory cells of the different pair of memory cells when the value of the first attribute of the feature vector is within a range of possible values of the first attribute of the feature vector including its particular value and when the value of the second attribute of the feature vector is within a range of possible values of the second attribute of the feature vector including its particular value.

4. The method of claim 3, further comprising:
concurrently searching for an exact match to a particular value of the first attribute of the feature vector and searching for an inexact match to the particular value of the second attribute of the feature vector by applying respective voltage levels to the control gates of the pair of memory cells to activate both memory cells of the pair of memory cells only when the value of the first attribute of the feature vector is its particular value and by applying respective voltage levels to the control gates of the different pair of memory cells to activate both memory cells of the different pair of memory cells when the value of the second attribute of the feature vector is within a range of possible values of the second attribute of the feature vector including its particular value.

5. The method of claim 2, wherein the possible values of the first attribute of the feature vector and the possible values of the second attribute of the feature vector are represented by a same set of respective combinations of two data states of the N possible data states.

6. The method of claim 1, wherein activating both memory cells of the pair of memory cells when the value of the attribute of the feature vector is within the range of possible values of the attribute of the feature vector including the particular value comprises a range spanning two or more possible values of the attribute of the feature vector.

7. The method of claim 1, wherein activating both memory cells of the pair of memory cells when the value of the attribute of the feature vector is within the range of possible values of the attribute of the feature vector including the particular value comprises a range selected from a group consisting of a range of possible values of the attribute of the feature vector less than some specific value of the possible values of the attribute of the feature vector, a range of possible values of the attribute of the feature vector greater than the specific value of the possible values of the attribute of the feature vector, and a range of possible values of the attribute of the feature vector greater than the specific value of the possible values of the attribute of the feature vector and less than some other value of the possible values of the attribute of the feature vector.

8. A method of searching a memory, comprising:
comparing a value of an attribute of a feature vector stored in a pair of memory cells of a string of series-connected memory cells of the memory to a value of an attribute of a target vector input to the memory, wherein the value of the attribute of the feature vector is represented by respective threshold voltages of the pair of memory cells, and wherein the value of the attribute of the target vector is represented by respective voltage levels applied to control gates of the pair of memory cells; and indicating a match between the value of the attribute of the feature vector and the value of the attribute of the target vector responsive to whether conduction occurs through the pair of memory cells while the respective voltage levels representing the value of the attribute of the target vector are applied to the control gates of the pair of memory cells;

wherein each threshold voltage of the respective threshold voltages of the pair of memory cells is selected from a set of different threshold voltages containing at least three members; and wherein each voltage level of the respective voltage levels applied to the control gates of the pair of memory cells is selected from a set of different voltage levels containing at least three members.

9. The method of claim 8, wherein indicating a match between the value of the attribute of the feature vector and the value of the attribute of the target vector responsive to whether conduction occurs through the pair of memory cells while the respective voltage levels representing the value of the attribute of the target vector are applied to the control gates of the pair of memory cells further comprises indicating the match further responsive to applying a voltage level to at least one other memory cell of the string of series-connected memory cells sufficient to activate that at least one other memory cell regardless of its data state.

10. The method of claim 8, wherein each possible value of the attribute of the feature vector is represented by a respective combination of the set of different threshold voltages and wherein each possible value of the attribute of the target vector is represented by a respective combination of the set of different voltage levels.

11. The method of claim 10, wherein at least one possible value of the attribute of the feature vector corresponds to a range of possible values of the attribute of the target vector, and wherein indicating a match between the value of the attribute of the feature vector and the value of the attribute of the target vector comprises indicating a match between the value of the attribute of the feature vector and the value of the attribute of the target vector for more than one possible value of the attribute of the target vector.

12. The method of claim 10, wherein at least one possible value of the attribute of the target vector corresponds to a range of possible values of the attribute of the feature vector, and wherein indicating a match between the value of the attribute of the feature vector and the value of the attribute of the target vector comprises indicating a match between the value of the attribute of the target vector and the value of the attribute of the feature vector for more than one possible value of the attribute of the feature vector.

13. A memory, comprising:
an array of memory cells; and
a controller for accessing the array of memory cells, wherein the controller is configured to:
store a value of an attribute of a feature vector to a pair of memory cells of a string of series-connected memory cells of the array of memory cells by programming each memory cell of the pair of memory cells to a respective data state of N possible data states with N being an integer value greater than two, wherein each possible value of the attribute of the feature vector is represented by a respective combination of two data states of the N possible data states;
search for an exact match to a particular value of the attribute of the feature vector by applying respective voltage levels to control gates of the pair of memory cells to activate both memory cells of the pair of memory cells only when the value of the attribute of the feature vector is the particular value; and
search for an inexact match to the particular value of the attribute of the feature vector by applying respective voltage levels to the control gates of the pair of memory cells to activate both memory cells of the pair of memory cells when the value of the attribute of the feature vector is within a range of possible values of the attribute of the feature vector including the particular value.

14. The memory of claim 13, further comprising:
a page buffer to store data indicative of a state of conduction of the string of series-connected memory cells while applying the respective voltage levels to the control gates of the pair of memory cells.

15. The memory of claim 14, wherein the controller is further configured to:
apply voltage levels to a different pair of memory cells of the string of series-connected memory cells, while applying the respective voltage levels to the control gates of the pair of memory cells, sufficient to activate both memory cells of the different pair of memory cells regardless of their data state.

16. The memory of claim 13, wherein the feature vector is a first feature vector, and wherein the controller is further configured to:
store a value of an attribute of a second feature vector to a different pair of memory cells of the string of series-connected memory cells of the memory by programming each memory cell of the different pair of memory cells to a respective data state of the N possible data states, wherein each possible value of the attribute of the second feature vector is represented by a respective combination of two data states of the N possible data states;
search for an exact match to a particular value of the attribute of the second feature vector by applying respective voltage levels to control gates of the different pair of memory cells to activate both memory cells of the different pair of memory cells only when the value of the attribute of the second feature vector is its particular value; and
search for an inexact match to the particular value of the attribute of the second feature vector by applying respective voltage levels to the control gates of the different pair of memory cells to activate both memory cells of the different pair of memory cells when the value of the attribute of the second feature vector is within a range of possible values of the attribute of the second feature vector including its particular value.

17. The memory of claim 16, wherein the controller is further configured to:
concurrently search for an exact match to both the particular value of the attribute of the first feature vector and the particular value of the attribute of the second feature vector by applying respective voltage levels to the control gates of the pair of memory cells and the different pair of memory cells to activate both memory cells of the pair of memory cells and both memory cells of the different pair of memory cells only when the value of the attribute of the first feature vector is its particular value and when the value of the attribute of the second feature vector is its particular value; and
concurrently search for an inexact match to both the particular value of the attribute of the first feature vector and the particular value of the attribute of the second feature vector by applying respective voltage levels to the control gates of the pair of memory cells and the different pair of memory cells to activate both memory cells of the pair of memory cells and both memory cells of the different pair of memory cells when the value of the attribute of the first feature vector is within a range of possible values of the attribute of the first feature vector including its particular value and when the value of the attribute of the second feature vector is within a range of possible values of the attribute of the second feature vector including its particular value.

18. The memory of claim 17, wherein the controller is further configured to:
concurrently search for an exact match to a particular value of the attribute of the first feature vector and search for an inexact match to the particular value of the attribute of the second feature vector by applying respective voltage levels to the control gates of the pair of memory cells to activate both memory cells of the pair of memory cells only when the value of the attribute of the first feature vector is its particular value and by applying respective voltage levels to the control gates of the different pair of memory cells to activate both memory cells of the different pair of memory cells when the value of the attribute of the second feature vector is within a range of possible values of the attribute of the second feature vector including its particular value.

19. The memory of claim 13, wherein the controller is further configured to search for an inexact match to the particular value of the attribute of the feature vector within a range of possible values of the attribute of the feature vector spanning two or more possible values of the attribute of the feature vector.

20. The memory of claim 13, wherein the controller is further configured to search for an inexact match to the particular value of the attribute of the feature vector within a range of possible values of the attribute of the feature vector selected from a group consisting of a range of possible values of the attribute of the feature vector less than some specific value of the possible values of the attribute of the feature vector, a range of possible values of the attribute of the feature vector greater than the specific value of the possible values of the attribute of the feature vector, and a range of possible values of the attribute of the feature vector greater than the specific value of the possible values of the attribute of the feature vector and less than some other value of the possible values of the attribute of the feature vector.

\* \* \* \* \*